(12) United States Patent
Elmer et al.

(10) Patent No.: US 6,710,851 B1
(45) Date of Patent: Mar. 23, 2004

(54) MULTI PATTERN RETICLE

(75) Inventors: James R. B. Elmer, Vancouver, WA (US); Ann I. Kang, Portland, OR (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/060,002

(22) Filed: Jan. 29, 2002

(51) Int. Cl.[7] .......................... G03B 27/42; G03B 27/44
(52) U.S. Cl. ............................................. 355/53; 355/46
(58) Field of Search .................................. 355/46, 53

(56) References Cited

U.S. PATENT DOCUMENTS

| | | | | |
|---|---|---|---|---|
| 3,716,296 A | * | 2/1973 | Springer et al. | 355/53 |
| 4,748,478 A | * | 5/1988 | Suwa et al. | 355/53 |
| 4,758,863 A | * | 7/1988 | Nikkel | 355/40 |
| 5,308,741 A | * | 5/1994 | Kemp | 430/312 |
| 5,705,299 A | * | 1/1998 | Tew et al. | 430/5 |
| 5,995,200 A | * | 11/1999 | Pierrat | 355/53 |
| 6,040,892 A | * | 3/2000 | Pierrat | 355/53 |
| 6,421,111 B1 | * | 7/2002 | Pierrat | 355/53 |
| 2002/0176065 A1 | * | 11/2002 | Pierrat | 355/77 |

* cited by examiner

*Primary Examiner*—Rodney Fuller
(74) *Attorney, Agent, or Firm*—Luedeka, Neely & Graham, PC (57) ABSTRACT

A reticle includes multiple different layer patterns selected from a group comprising same circuit layer patterns and different circuit layer patterns. The layer patterns are positioned on the reticle within borders and within a portion of a defined x by y array on the reticle. The reticle is used to produce an integrated circuit of a single design or integrated circuits of multiple designs.

11 Claims, 3 Drawing Sheets

MULTI PATTERN RETICLE

FIELD

This invention relates to the field of fabricating integrated circuits. More particularly, this invention relates to the design, layout, and use of reticles in photolithographic manufacturing of integrated circuits.

BACKGROUND

In a photolithographic manufacturing process for integrated circuits, it is common to use reticles upon which patterns are formed. The patterns are also called "layer patterns" herein because the patterns are imaged onto an integrated circuit substrate that is coated with a light sensitive material, to ultimately pattern a layer of an integrated circuit. Typically, multiple reticles are required to produce a desired integrated circuit. A significant amount of money is generally devoted to producing the reticles needed for fabricating the integrated circuits. For example, a single integrated circuit may require twenty to thirty reticles, at a cost of several thousand dollars each. Thus, the time and expense of producing reticles is of particular concern. This is especially of concern in low volume integrated circuit fabrication, such as prototyping or other design verification.

SUMMARY

In the present invention, the time and expense for producing reticles is minimized by designing the reticle to have multiple different layer patterns formed thereon for producing multiple different layers of the same or different integrated circuits.

In accordance with an embodiment of the present invention, an apparatus is provided for producing integrated circuits that includes a reticle with a number of layer patterns disposed on the reticle. At least some of the layer patterns on the reticle are different from others of the layer patterns and the layer patterns are selected from a group of same circuit layer patterns and different circuit layer patterns. A same circuit layer pattern corresponds to different layers of one design of an integrated circuit and different circuit layer patterns correspond to different layer patterns from different designs of integrated circuits.

A light source provides and directs light onto individual layer patterns on the reticle, and an integrated circuit substrate is disposed to receive light from the reticle. An image is formed on the integrated circuit substrate, and the image corresponds to one of the layer patterns on the reticle. A scanner moves the integrated circuit substrate relative to the reticle, and a controller associated with the scanner controls the relative positioning of the integrated circuit substrate. The controller causes selected images of the layer patterns to be projected on or disposed on selected areas of the integrated circuit substrate. Thus, the layer patterns on the reticle are imaged onto the substrate as part of a photolithographic process that produces one or more desired integrated circuits.

In this manner, several different mask layers for a single integrated circuit design, such as a prototype design, are placed on a single reticle, rather than on multiple reticles. Thus, fewer reticles are required to fabricate the integrated circuit, and less expense is incurred in producing the mask set. Alternately, the different mask layers on a single reticle are used for the various layers of different integrated circuit designs, rather than for the layers of a single integrated circuit design. This also reduces the number of reticles that are needed to fabricate the different integrated circuit designs. Although this type of reticle is preferably used for prototype fabrication, or very small run production, it could also be used in full scale production of integrated circuits.

In accordance with a method embodiment of the present invention, a plurality of layer patterns are formed on a reticle. The layer patterns are selected from the group of same circuit layer patterns and different circuit layer patters, where the same circuit layer patterns correspond to different layers of one design of an integrated circuit and where the different circuit layer patterns correspond to different layer patterns from different designs of integrated circuits.

In one embodiment, the reticle is used in a photolithographic process to project multiple different images on the same area of an integrated circuit substrate to form multiple layers of one integrated circuit.

In an alternate embodiment of the method, the reticle may also be used to project multiple different images on different areas of one or more integrated circuits to form layers of different design on one or more integrated circuit substrates. Alternately, an embodiment could use the reticle to do both of the above methods in the same process. That is, the reticle would be used to project multiple different images on the same area of an integrated circuit to form multiple layers of one integrated circuit design and the reticle would be used to project multiple different images on different areas of one or more integrated circuit substrates to form layers of different integrated circuit designs.

In accordance with a more detailed embodiment of the present invention, a method produces an integrated circuit by providing an integrated circuit substrate and forming a light sensitive layer on the substrate. The light sensitive layer reacts when exposed to light. A reticle is also provided and a plurality of layer patterns are formed on the reticle. The layer patterns are selected from the group of same circuit layer patterns and different circuit layer patterns where the same circuit layer patterns correspond to different layers of one design and where the different circuit layer patterns correspond to different layer patterns from different designs.

Light is directed onto one pattern of the reticle and the light sensitive layer is exposed to light from the one pattern so that a light image of the one pattern is formed on the light sensitive layer. The light image on the light sensitive layer forms a reacted region in the form of the light image of the one pattern. A portion of the light sensitive layer is removed from the integrated circuit to form a desired pattern in the light sensitive layer corresponding to the reacted region. The substrate is then processed to form a desired feature in or on the substrate corresponding in part to the desired pattern in the light sensitive layer.

A new layer of integrated circuit material is formed over the desired features and a new light sensitive layer is formed over the new layer of integrated circuit material. Light is again directed onto the reticle, but this time onto a different pattern of the reticle. Light from the different pattern is exposed onto the new light sensitive layer on the integrated circuit substrate to form a light image of the different pattern. The light sensitive layer reacts to the light image to form a new reacted region in the light sensitive layer in the form of the light image of the different pattern. Again, a portion of the light sensitive layer is removed from the integrated circuit substrate to form a new desired pattern in the light sensitive layer corresponding to the new reacted region.

The substrate is then processed to form new desired features on the substrate corresponding in part to the new desired pattern in the light sensitive layer. Thereafter, the remaining portion of the light sensitive layer is removed and the steps of forming new layers of integrated circuit material and a new light sensitive layer are repeated followed by a repetition of the directing, exposing, removing, processing and the second removing step. These series of steps are repeated until a desired integrated circuit is constructed.

In accordance with yet another embodiment of the present invention, a reticle is produced for making layers for one or more designs of integrated circuits. For a particular integrated circuit scanner, a maximum field size is determined and then within that maximum field size, a field size for each sub field in a plurality of x by y arrays of sub fields is determined. In making this determination, the size of the borders around and between the sub fields as required by the particular scanner is considered. The size of sub fields for different x by y arrays is determined where x and y define the number of rows and columns in the array and where x and y vary within a predetermined range.

The maximum size of a selected layer pattern in a particular integrated circuit design is determined and then an array is selected to have sub fields with dimensions sufficient to contain the selected layer pattern. At least a portion of the selected array is formed on the reticle to form at least one sub field on the reticle. Then, the selected layer pattern is formed in the sub field of the reticle. If additional layer patterns are needed, the above steps of determining a maximum field size, determining maximum sub field sizes, selecting, forming a portion of the array and forming a selected layer pattern are repeated until the reticle is full.

In the above method, sub fields from only one array may be formed on the reticle, or sub fields from different arrays may be formed on the reticle. Preferably, the centers of the sub field and the centers of each layer pattern are aligned and the scanner is programmed to position the integrated circuit substrate relative to the layer patterns based on the positions of the centers of the sub fields.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
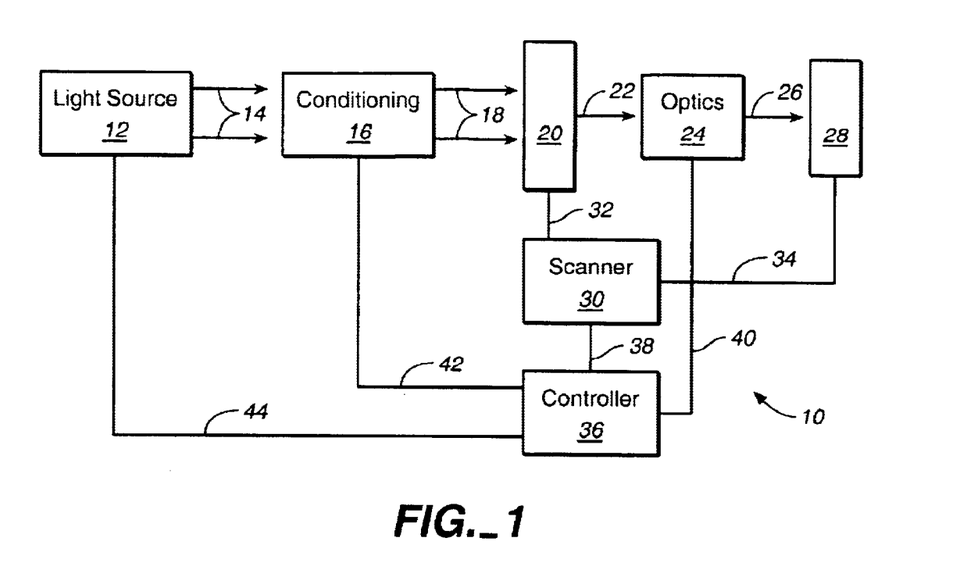
FIG. 1 is a schematic block diagram of an integrated circuit exposure apparatus constructed in accordance with the present invention.

Referring now to the drawings in which like reference characters designate like or corresponding parts throughout the several views, an exposure apparatus 10 is schematically illustrated in FIG. 1. The apparatus 10 includes a light source 12 that produces light 14 which is transmitted to a light conditioning apparatus 16. One example of an acceptable light source would be deep ultraviolet light source. The conditioning apparatus 16 selectively receives light 14 and produces light 18 in a condition for projecting upon a reticle 20 which carries patterns (not shown). The conditioning apparatus 16 may include optical lenses, mirrors and apertures, such as slits, for the purpose of controlling and directing the light 18 onto a highly defined and precise area of the reticle 20, producing light 22.

Light 22 carries information as to patterns formed on the reticle 20. The light 22 is selectively received by optics 24 which may include mirrors, lenses, filters, apertures and other optical devices for directing light 26 onto the integrated circuit substrate 28. In the preferred mode of operation, the optics 24 focuses the light 26 to project images on the substrate 28. The images are images of the patterns disposed on the reticle 20.

A scanner 30 is preferably mechanically interconnected with the reticle 20 as indicated by line 32 and with the integrated circuit substrate 28 as indicated by line 34. The scanner 30 preferably controls the position of the reticle 20 and the substrate 28 so that any sub field in the reticle 20 may be imaged onto the integrated circuit 28.

A controller 36 is also preferably connected to the conditioning apparatus 16 via line 42, to the light source 12 via control line 44, and to the optics 24 via line 40. The controller 36 through these lines 40, 42, and 44 controls the operation of these devices. For example, the controller 36 turns on and off the light source 12, and controls the intensity of light. The conditioning apparatus 16 is controlled to focus or align the optics to ensure that the light 18 exiting the apparatus 16 is properly conditioned. Preferably, collimated light 18 is provided by the apparatus 16.

The exposure apparatus 10 represents one example or illustration of an embodiment of the invention, but there is no intention to limit the invention to this setup, the illustrated parts, or the arrangement of parts.

Figure 2:
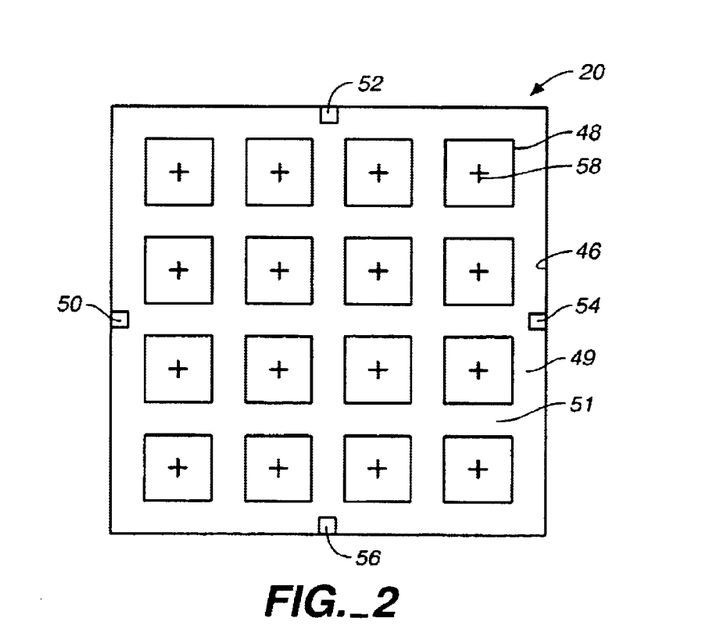
FIG. 2 is a diagrammatic plan view of a reticle.

Referring to FIG. 2, a plan view of a reticle 20 is illustrated and represents one reticle that is useful in an embodiment of the invention. The reticle 20 of FIG. 2 has a perimeter 46 which defines the overall field of the reticle, but which may not be the useable field size. Disposed within the perimeter 46 are sixteen sub fields 48 arranged in a four by four array. The entire array is surrounded by a border 49, and borders 51 are formed between each sub field 48. The width or size of the borders 49 and 51 is preferably determined by the needs of the exposing apparatus 10. Preferably, the reticle 20 is constructed of a transparent planar material substantially free of optical defects such as optical glass or quartz. The borders 49 and 51 are in one embodiment formed of an opaque material, preferably a reflective opaque material such as chromium. Alignment patterns 50, 52, 54 and 56 may also be formed on the reticle, preferably in the borders adjacent to the outer perimeter of the reticle, but other locations could suffice. The alignment patterns 50–56 are used to properly position the reticle in the exposure apparatus 10.

Each of the sub fields 48 preferably includes a defined center point 58 represented by "+" symbols in FIG. 2. These defined center points are used in one embodiment to position patterns in the sub fields 48 as hereinafter described. It is appreciated that the center points 58 as depicted in FIG. 2 represent a logical position within each sub field 48, and not a physical structure on the reticle 20.

Figure 3:
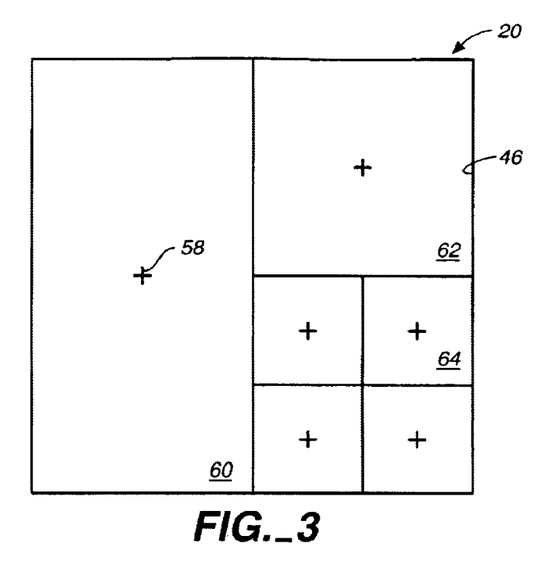
FIG. 3 is a diagrammatic plan view of a second reticle.

FIG. 3 represents an alternate embodiment of the reticle 20, in which the sub fields 48 are of different sizes. Further, there is no perimeter border 49 or interstitial borders 51 surrounding the sub fields 48. Finally, there are no alignment patterns 40, 52, 54, or 56 in the embodiment of the reticle 20 depicted in FIG. 3. Thus, the reticle 20 of FIG. 3 is preferably used in an alignment apparatus 10 that does not require alignment marks or a border between sub fields 48.

In the reticle 20 of FIG. 3, three different sizes of sub fields are shown, sub field 60, sub field 62 and sub field 64. Sub field 60 corresponds to a two by one array for the reticle 20 and covers about half of the useable field of the reticle 20. Sub field 62 corresponds to a two by two array and covers one quarter of the useable field. The four sub fields 64 correspond to a four by four array and occupy one quarter of the useable field of the reticle 20.

It is appreciated that, if there are perimeter borders 49 or interstitial borders 51 surrounding the sub fields 60, 62, and 64, the total area of the four sub fields 64 may not be equal to the area of the sub field 62, even though the sub fields 64 occupy one quarter of the useable space of reticle 20, and so does sub field 62. It is further appreciated that the use of borders tends to cause the smaller sub fields to provide less useable space for a given amount of actual space occupied on the reticle 20.

The reticle 20 of FIG. 3 illustrates that different sizes of sub fields may be used on the reticle 20 for producing different sized integrated circuits. In this example, the sub field 60 corresponds to a large integrated circuit, the sub field 62 corresponds to a medium integrated circuit and the sub fields 64 are used to make a small integrated circuit. Each of the sub fields 60, 62 and 64 preferably include logical center points 58, such as may be used for aligning as described hereinafter.

Figure 4:
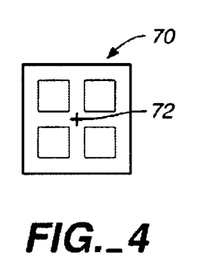
FIG. 4 is a diagrammatic illustration of a different layer pattern for an integrated circuit design.
Figure 5:
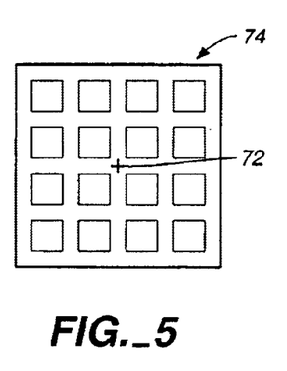
FIG. 5 is a diagrammatic illustration of a different layer pattern for an integrated circuit design.
Figure 6:
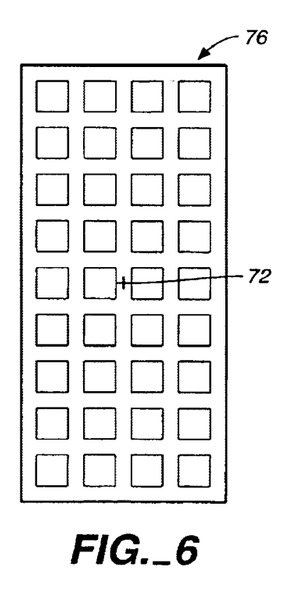
FIG. 6 is a diagrammatic illustration of a different layer pattern for an integrated circuit design.

Referring now to FIG. 4, there is shown a schematic plan view of a pattern 70 corresponding to the configuration of one layer of a small integrated circuit. Likewise, FIG. 5, represents a plan schematic representation of a medium pattern 74 corresponding to the configuration of a medium integrated circuit layer, and FIG. 6 diagrammatically shows a large integrated circuit pattern 76. Pattern 70 is dimensioned to fit within the sub field 64 of FIG. 3 and pattern 74 and 76 are dimensioned to fit within the sub fields 62 and 60, respectively. To make the reticle 20 of FIG. 3, the pattern 76 is formed within the sub field 60 with its center point 72 aligned with the center point 58 of the sub field 60. Likewise, the pattern 74 is formed on the sub field 72 with the center point 72 aligned with the center point 58 of the sub field 62. Finally, four copies of pattern 70, or four different copies of patterns having the same or smaller size of pattern 70, are formed on the four sub fields 64 with the center points 72 of the four patterns 70 aligned with the center points 58 of the sub fields 64.

It is appreciated that the pattern 70 may also be dimensioned to fit within the sub fields 48 of FIG. 2, for example. Thus, using the reticle 20 of FIG. 2, sixteen different patterns could be formed on the sixteen different sub fields 48, each of the patterns having a size equal to or less than the size of pattern 70 shown in FIG. 4.

The Design of Reticles

One feature of the present invention is to form different patterns on at least some of the sub fields on the reticle 20. For example, in the reticle 20 of FIG. 2, sixteen different patterns could be placed in the sub fields 48 corresponding to sixteen different layers of one integrated circuit design. Alternately, the sixteen different patterns placed in the sub fields 48 correspond to sixteen layer of several integrated circuit designs. Of course, in further alternate embodiments the various sub fields 48 hold some combination of different layers for a single integrated circuit and layers for different integrated circuits.

One of the first steps in the process of designing the reticle 20 is to determine the maximum field size allowable by a particular exposure apparatus 10. Also, one preferably determines the amount of border 49 and 51 that may be required. That is, the width of the external borders 49 and the internal borders 51 as shown in FIG. 2, if required, are preferably determined at this point. The maximum field size is preferably determined for several multi-pattern occurrences by dividing the maximum field size by the number of images desired per reticle field and subtracting the border requirement. Preferably, a table, such as that shown in Table One below is prepared showing maximum field sizes for several multi-pattern reticles.

TABLE ONE

| Array Type | X Dimension | Y Dimension |
| --- | --- | --- |
| One by One | X-2OB | Y-2OB |
| One by Two | X-2OB | (Y-(2OB+IB))/2 |
| Two by Two | (X-(2OB+IB))/2 | (Y-(2OB+IB))/2 |
| * | | |
| * | | |
| * | | |
| Four by Four | (X-(2OB+3IB))/4 | (X-(2OB+3IB))/4 |

Where:

OB is the width of an outer boundary.

IB is the width of an inner boundary.

X is the maximum field size in the x dimension.

Y is the maximum field size in the y dimension.

The center location 58 of each sub field on each reticle 20 is preferably determined. Again, it is preferred to provide a table, such as Table Two, which shows the center image positions 58 for a two by two reticle design.

TABLE TWO

|  | Column⇒ | |
| --- | --- | --- |
| Row⇓ | 1 | 2 |
| 1 | OB+((X-(2OB+IB))/2)/2, OB+IB+(Y-(2OB+IB))/2 | OB+IB+(X-(2OB+IB))/2, OB+IB+(Y-(2OB+IB))/2 |
| 2 | OB+((X-(2OB+IB))/2)/2, OB+((Y-(2OB+IB))/2)/2 | OB+IB+(X-(2OB+IB))/2, OB+((Y-(2OB+IB))/2)/2 |

Where:

OB is the width of an outer boundary.

IB is the width of an inner boundary.

X is the maximum field size in the x dimension.

Y is the maximum field size in the y dimension.

This center position is useful for a variety of purposes, such as the creation of a software routine for the stepper/scanner 30 that defines the imaging operation. For example, to determine the dimensions of the fields for an array having two fields in the x dimension and two fields on the y dimension, Table one shows the x dimension as:

$$(X-(2OB+IB))/2,$$

and the y dimension as:

$$Y-(2OB+IB)/2.$$

Table Two then provides the center points in the sub fields for a two by two array. Tables One and Two are simplified examples to clearly illustrate how the tables are created without undue complication, and the tables may be expanded to arrays having a larger number of rows and columns.

The patterns to be associated with a given multi-pattern reticle 20 are preferably determined based upon criteria such as design and reticle type. Thus, there is flexibility in determining the design layers or patterns that can be grouped on each reticle 20. For a particular integrated circuit, the maximum size of the pattern necessary to create a layer of the circuit is preferably obtained and, referring to Table One, a reticle sub field is chosen for containing or receiving the layer pattern. A sub field is preferably selected as having the smallest size possible, but still large enough to contain the pattern for the particular integrated circuit layer in question. In this manner, a greater number of sub fields, and layer patterns, can be placed on a single reticle 20.

As described above, the pattern corresponding to the layer is preferably placed in the sub field with the center of the pattern positioned on the center of the sub field location, such as specified in Table Two. A software job on the scanner 30 is preferably written to only expose a single pattern on at a time on the multi-pattern reticle 20. Each pattern is preferably exposed at different steps in the process of manufacturing either a single integrated circuit or multiple different integrated circuits. In other embodiments, more than one sub field is exposed simultaneously.

To further illustrate the design process, consider an example where a particular integrated circuit has sixteen different layers defined by sixteen different patterns, such as pattern 70 shown in FIG. 4. Each of the sixteen patterns have the same exact dimensions and, referring to Table One, it is determined that the pattern 70 fits within the sub field of a sixteen by sixteen array of sub fields on the reticle 20. In such a case, each of the sixteen different patterns 70 are formed on the sixteen different sub fields 48 with the center point 72 of the patterns aligned with the center points 58 of the sub fields. The external border 49 and the internal borders 51 are formed preferably simultaneously with the patterns 70 on the reticle 20.

As another example of how a reticle is designed, consider a situation where three different integrated circuits are to be fabricated, and one each of the patterns 76, 74 and 70 need to be used in the fabrication process. The size of the pattern 76 is determined and compared to the sizes of the arrays in Table One. From this information, it is determined that the pattern 76 fits within the sub field of a two by one array, such as the sub field 60 shown in FIG. 3. Thus, the pattern 76 in one field of a one by two array is formed on the sub field 60 as shown in FIG. 3.

The size of the pattern 74 is determined and, referring to Table One, it is determined that the pattern 74 fits within the sub field of a four by four array. Thus, one sub field 62 is designed for the upper right hand corner of the reticle 20 of FIG. 3 in one field of a two by two array. Finally, it is determined that the pattern 70 fits in the sub field of a four by four array, by reference to Table One. Thus, four sub fields 64 are defined on the reticle 20 of FIG. 3, but the pattern 70 is formed in only one of those fields since only one pattern is desired to make one layer at a time.

It is appreciated that Tables One and Table Two have been greatly simplified and are purely hypothetical to illustrate the concepts of this embodiment. However, again for purposes of illustration only, Table Three below illustrates the types of arrays that are typical of actual die sizes and scanner field sizes.

TABLE THREE

Reticle layout table for each multilayer reticle occurrence.

|  | Number of Shots to cover the wafer | Max die size mm (wafer level) | Max die size mm (reticle level) | Fixed layer locations (reticle level) |
|---|---|---|---|---|
| 1 × 2 | 101 | 25 × 15.5 | 100 × 62 mm | (0.0, +/− 33.0) mm |
| 1 × 3 | 146 | 25 × 10 | 100 × 40 mm | (0.0, 0.0) mm |
|  |  |  |  | (0, +/− 44.0) mm |
| 1 × 4 | 199 | 25 × 7.25 | 100 × 29 mm |  |
| 2 × 2 | 189 | 12.125 × 15.5 | 48.5 × 62 mm | (+/− 25.75, +/− 33) mm |
| 2 × 3 | 280 | 12.125 × 10 | 48.5 × 40 mm | (+/− 25.75, 0.0) mm |
|  |  |  |  | (+/− 25.75, +/− 44.0) mm |
| 2 × 4 | 383 | 12.125 × 7.25 | 48.5 × 29 mm | (+/− 25.75, +/− 26.25) mm |
|  |  |  |  | (+/− 25.75, +/− 78.75) mm |
| 3 × 2 | 277 | 7.83 × 15.5 | 31.31 × 62 mm | (0.0, +/− 33.0) mm |
|  |  |  |  | (+/− 10.83, +/− 33.0) mm |
| 3 × 3 | 418 | 7.83 × 10 | 31.31 × 40 mm | (0.0, 0.0) mm |
|  |  |  |  | (0.0, +/− 44.0) mm |
|  |  |  |  | (+/− 34.333, +/− 44.0) mm |
| 3 × 4 | 567 | 7.83 × 7.25 | 31.33 × 29 mm | (0.0, +/− 16.5) mm |
|  |  |  |  | (0.0, +/− 49.5) mm |
|  |  |  |  | (+/− 34.33, +/− 16.5) mm |
|  |  |  |  | (+/− 34.33 m 49.5) mm |

Figure 7:
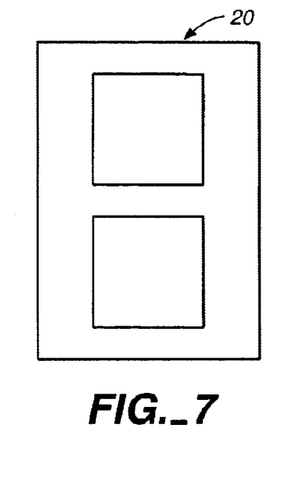
FIG. 7 shows a plan diagrammatic view of a one by two reticle.
Figure 8:
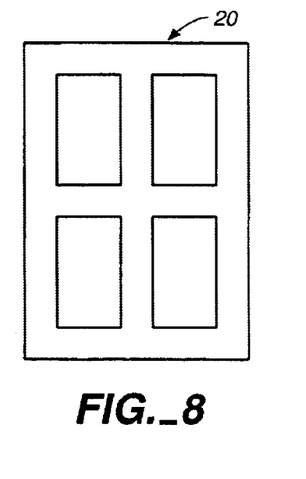
FIG. 8 shows a plan diagrammatic view of a two by two reticle.
Figure 9:
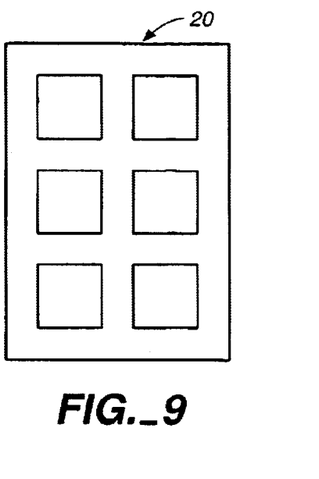
FIG. 9 shows a plan diagrammatic view of a two by three reticle.

FIGS. 7, 8 & 9 represent alternate embodiments of reticle 20. FIG. 7 represents a one by two array showing square sub fields on a rectangular reticle 20. FIG. 8 represents a two by two array showing rectangular sub fields on a rectangular reticle and FIG. 20 represents a two by three array showing square sub fields on a rectangular reticle.

Operation

The operation and use of the reticle 20 is now described with reference to FIGS. 1 and FIGS. 10–13. Referring to FIG. 1, the reticle 20 and the integrated circuit substrate 28 are mechanically fixed to the scanner 30 through mechanical connections 32 and 34. For this example the reticle 20 of FIG. 2 is used, and sixteen different patterns 70 are formed in the sub fields 48. The reticle 20 is positioned by the scanner 30 to produce an image of a first selected pattern on the integrated circuit substrate 28.

Figure 10:
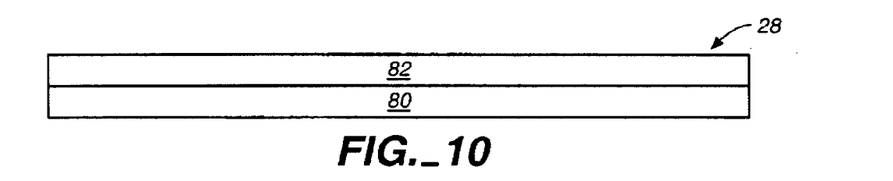
FIG. 10 is a cross sectional view of a integrated circuit substrate with a light sensitive layer formed thereon.

The substrate 28 is initially composed of substrate material 80 with a light sensitive layer 82 disposed on one surface. The light sensitive layer 82 is exposed to the image of the pattern projected thereon by the optics 24. In a typical application, the substrate 28 is a wafer on which a large number of integrated circuits are formed.

Figure 11:
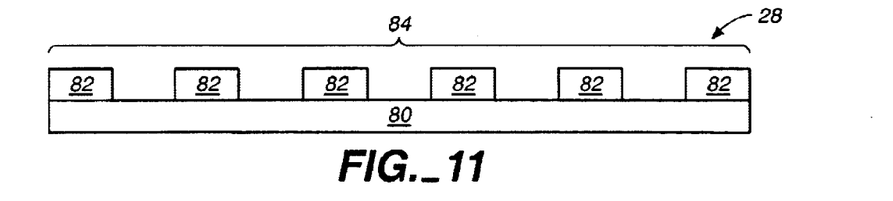
FIG. 11 shows the integrated circuit substrate with portions of the light sensitive layer removed.

The scanner 30 preferably moves the reticle 20 relative to the substrate 28 as necessary to expose a single pattern many times onto different areas of the substrate 28. During exposure, a portion of the light sensitive layer 82 reacts with the light, with the remaining portion designated as a non reacting region. The substrate 80 is processed to remove a portion of the light sensitive layer corresponding to the shape of the pattern that was imaged onto the layer. Depending upon the type of light sensitive layer, either positive or negative, the exposed region may be removed, or everything but the exposed region is removed. Thus, as depicted in FIG. 11, a pattern 84 is formed on the substrate 28 which corresponds to the pattern on the reticle 20 used to create the image that was projected onto the substrate 28.

Figure 12:
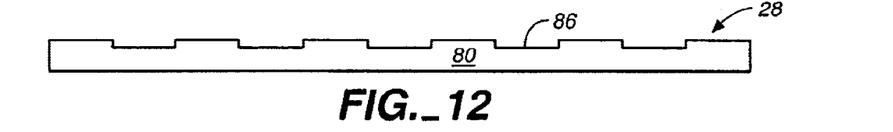
FIG. 12 shows the integrated substrate of FIG. 11 after it has been processed to form desired features in the substrate and after the remaining portion of the light sensitive layer has been removed.

The substrate 28 is processed to form desired characteristics and the remaining portion of the light sensitive layer is removed to form a substrate 28 as shown in FIG. 12. In one embodiment, for example, the substrate 28 of FIG. 11, with the pattern 84 disposed thereon, is doped with ions that are impregnated into the substrate material 80, thereby forming desired features, namely doped regions 86 in the substrate 28.

Figure 13:
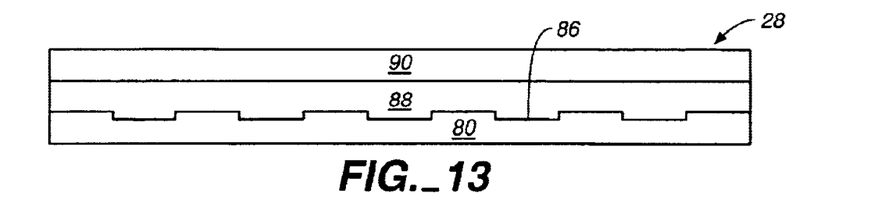
FIG. 13 is a cross sectional view of the substrate having the desired features formed therein with a new layer of material formed on the integrated circuit substrate and a new light sensitive layer formed on or over the layer of new integrated circuit material.

Continuing the hypothetical example, and with reference to FIG. 13, a new layer 88 of material is deposited or formed on the substrate 28, covering the doped regions 86 and a new light sensitive layer 90 is deposited on the new layer 88. The substrate 28 is then repositioned into the scanner 30 and its position is determined, such as by reference to the alignment patterns 50, 52, 54 and 56. The reticle 20 is repositioned to project a different pattern onto the substrate 28 and the process described above is repeated. That is, a new image is projected onto the light sensitive layer 90.

Preferably, multiple new images are sequentially imaged onto different areas of the substrate 20. Then the substrate 28 is removed and processed to remove a portion of the light sensitive layer 90 which creates a pattern that is used to create further features in the new layer 88 of the substrate material by continued processing. Then, yet another new layer of substrate material is formed on the substrate 28 and is covered by yet another layer of light sensitive material. The substrate 28 is then returned to the scanner 30 and the process is repeated until all of the desired layers are formed on the substrate.

Referring now to FIG. 3, it is appreciated that reticles 20 of the configuration of FIG. 3 may be used to substantially simultaneously produce three different integrated circuits on the same substrate 28. In one embodiment, for example, the substrate 28 has a number of different locations and a separate integrated circuit is formed at each of those locations. For example, the pattern that is formed in the sub field 60 is projected onto locations in the top ⅓ of the substrate 28, the pattern disposed in sub field 62 is projected onto locations in the middle ⅓ of the substrate 28, and the patterns disposed in the sub fields 64 are projected onto the locations in the lower ⅓ of the substrate.

In this example using reticles as shown in FIG. 3, three different sizes of integrated circuits are substantially simultaneously produced on one substrate 28. In alternate embodiments, the pattern associated with sub field 60 is used to expose one substrate and the pattern associated with field 62 is used to expose an entirely different substrate. Likewise, the pattern associated with sub field 64 is used to expose a third substrate. In this example, the reticle 20 of FIG. 3 produces three different integrated circuit layers on three different substrates.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. An apparatus for exposing integrated circuit substrates, comprising:

a reticle, a plurality of layer patterns disposed on the reticle, at least some of the layer patterns being different from others of the layer patterns and being selected from the group of same circuit layer patterns and different circuit layer patterns, where the same circuit layer patterns correspond to different layers of one circuit design and where the different circuit layer patterns correspond to different layers from different circuit designs, a light source for providing and directing light onto individual layer patterns on the reticle, an integrated circuit substrate disposed for receiving light from the reticle and forming an image on the integrated circuit substrate, the image corresponding to one of the layer patterns on the reticle, a scanner for providing relative movement of the integrated circuit substrate and the reticle, and a controller associated with the scanner for controlling the relative position of the integrated circuit substrate so that selected images of the layer patterns are disposed on selected areas of the integrated circuit substrate, whereby the layer patterns on the reticle are imaged onto the substrate as part of a photolithographic process for producing more than one different circuit designs on the integrated circuit substrate.

2. A method for producing more than one different circuit designs on an integrated circuit substrate, comprising:

forming a plurality of layer patterns on a reticle, the layer patterns being selected from the group of same circuit layer patterns and different circuit layer patterns, where the same circuit layer patterns correspond to different layers of one circuit design and where the different circuit layer patterns correspond to different layers from different circuit designs, and using the reticle in a photolithographic process to project multiple different images on the integrated circuit substrate to pattern multiple layers of more than one different circuit design on the integrated circuit substrate.

3. A method for producing a prototype integrated circuit, comprising:

forming a plurality of layer patterns on a reticle, the layer patterns being selected from the group of same circuit layer patterns and different circuit layer patterns, where the same circuit layer patterns correspond to different layers of one circuit design and where the different circuit layer patterns correspond to different layers from different circuit designs, and using the reticle to project multiple different images on different areas of one or more integrated circuit substrates to form layers of different designs on one or more integrated circuit substrates.

4. A method for producing an integrated circuit, comprising:

a) providing an integrated circuit substrate, b) forming a light sensitive layer on the integrated circuit substrate that reacts when exposed to light, c) providing a reticle, d) forming a plurality of layer patterns on the reticle, the layer patterns being selected from the group of same circuit layer patterns and different circuit layer patterns, where the same circuit layer patterns correspond to different layers of one circuit design and where the different circuit layer patterns correspond to different layers from different circuit designs, and e) directing light onto selected patterns on the reticle, where the selected patterns include at least one each of the same circuit layer patterns and the different circuit layer patterns, f) exposing the light sensitive layer to light from the selected patterns to form light images of the selected patterns on the light sensitive layer, the light sensitive layer reacting to the light images to form reacted regions in the light sensitive layer in the form of the light images of the selected patterns, g) removing a portion of the light sensitive layer from the integrated circuit substrate to form desired patterns in the light sensitive layer corresponding to the reacted regions, h) processing the substrate to form desired features on the substrate corresponding in part to the desired patterns in the light sensitive layer, i) removing the remaining portion of the light sensitive layer, j) forming a new layer of integrated circuit material over the desired features, k) forming a new light sensitive layer over the new layer of integrated circuit material, l) directing light onto different patterns on the reticle, where the different patterns include at least one each of the same circuit layer patterns and the different circuit layer patterns, m) exposing light from the different patterns onto the new light sensitive layer on the integrated circuit substrate to form light images of the different patterns, the light sensitive layer reacting to the light images to form new reacted regions in the light sensitive layer in the form of the light images of the different patterns, n) removing a portion of the light sensitive layer from the integrated circuit substrate to form new desired patterns in the light sensitive layer corresponding to the new reacted regions, o) processing the substrate to form new desired features on the substrate corresponding in part to the now desired patterns in the light sensitive layer, p) removing the remaining portion of the light sensitive layer, and q) repeating steps j through p until the integrated circuit is constructed.

5. A method of producing a reticle for producing layers for more than one design of integrated circuits, comprising:

a) determining the maximum field size for a particular integrated circuit scanner, b) determining the maximum field size for each sub field in plurality of x by y arrays of sub fields defined within the maximum field with borders between the sub fields as required by the particular scanner, where x and y define the number of rows and columns in the army and where x and y vary within a predetermined range, c) determining the maximum size of a selected layer pattern in a particular integrated circuit design, d) selecting an array having sub fields with dimensions sufficient to contain the selected layer pattern, e) defining at least a portion of the selected array to define at least one sub field on a reticle, f) forming the selected layer pattern of the particular integrated circuit design in the sub field on the reticle, and g) if additional layer patterns are needed, then repeating steps b through f until the reticle is full.

6. The method of claim 5 wherein sub fields from only one array are formed on the reticle.

7. The method of claim 5 wherein sub fields from different arrays are formed on the reticle.

8. The method of claim 5 further comprising:

locating and recording the center of each sub field and the center of each layer pattern, forming the layer patterns on the reticle with the center of the layer patterns aligned with the center of the sub fields, and programming the scanner to position the integrated circuit substrate relative to the layer patters based on the positions of the centers of the sub fields.

9. A reticle for use in manufacturing different integrated circuits composed of multiple different layers on a common substrate, comprising:

a transparent planar member having a perimeter, a plurality of sub fields defined on the planar member having external edges near the perimeter of the transparent member and having internal edges remote from the perimeter, a plurality of different layer patterns and different circuit patterns disposed in different sub fields, at least one of the different layer patterns corresponding to a different one of the layers of the integrated circuit, external borders formed on the transparent member along the perimeter of the transparent member and being contiguous with a plurality of the external edges of the sub fields, and internal borders formed between the internal edges of the sub fields.

10. The reticle of claim 9 further comprising each sub field having dimensions sufficient to contain the different layer patterns and having dimensions selected from the dimensions of hypothetical arrays of sub fields defined on the transparent member, the arrays of sub fields being sized according to the dimensions of the transparent member and the internal and external borders required for each array.

11. A reticle for use in manufacturing different integrated circuits having different layers on a common substrate, comprising:

a transparent planar member, a plurality of sub fields on the planar member, and a plurality of different layer patterns and different circuit patterns disposed in the sub fields, the different layer patterns corresponding to the different layers of a given integrated circuit, and the different circuit patterns corresponding to different integrated circuits.

* * * * *